(12) United States Patent
Tsuji et al.

(10) Patent No.: US 7,645,523 B2
(45) Date of Patent: Jan. 12, 2010

(54) ORGANIC ELECTROLUMINESCENCE ELEMENT

(75) Inventors: Taishi Tsuji, Tsurugashima (JP); Satoshi Miyaguchi, Tsurugashima (JP); Takeo Wakimoto, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/282,244

(22) Filed: Oct. 29, 2002

(65) Prior Publication Data

US 2003/0129452 A1 Jul. 10, 2003

(30) Foreign Application Priority Data

Oct. 31, 2001 (JP) ............... 2001-334325

(51) Int. Cl.
*H01J 1/62* (2006.01)
(52) U.S. Cl. .............. 428/690; 428/917; 313/504; 313/506; 257/102; 257/103
(58) Field of Classification Search ............. 428/690, 428/917; 252/301.16; 313/504, 506; 315/506; 257/102, 103, E51.04, 40
See application file for complete search history.

(56) References Cited

U.S. PATENT DOCUMENTS

| | | | | |
|---|---|---|---|---|
| 5,405,709 A | * | 4/1995 | Littman et al. | 428/690 |
| 5,409,783 A | * | 4/1995 | Tang et al. | 428/690 |
| 5,466,392 A | * | 11/1995 | Hironaka et al. | 252/301.16 |
| 6,001,284 A | * | 12/1999 | Enokida et al. | 252/583 |
| 6,137,223 A | * | 10/2000 | Hung et al. | 313/506 |
| 6,208,077 B1 | * | 3/2001 | Hung | 313/506 |
| 6,287,712 B1 | | 9/2001 | Bulovic et al. | |
| 6,303,238 B1 | * | 10/2001 | Thompson et al. | 428/690 |
| 6,551,725 B2 | * | 4/2003 | Raychaudhuri et al. | 428/690 |
| 6,602,618 B2 | * | 8/2003 | Watanabe et al. | 428/690 |
| 6,645,645 B1 | * | 11/2003 | Adachi et al. | 428/690 |
| 6,815,091 B2 | * | 11/2004 | Takiguchi et al. | 428/690 |
| 6,902,830 B2 | * | 6/2005 | Thompson et al. | 428/690 |
| 2002/0022149 A1 | * | 2/2002 | Watanabe et al. | 428/690 |
| 2003/0072964 A1 | * | 4/2003 | Kwong et al. | 428/690 |
| 2005/0233164 A1 | * | 10/2005 | Tsuji et al. | 428/690 |

FOREIGN PATENT DOCUMENTS

| | | |
|---|---|---|
| JP | 10-88121 A | 4/1998 |
| JP | 2000-182768 A | 6/2000 |
| JP | 2001-237079 A | 8/2001 |
| JP | 2001-284056 A | 10/2001 |
| JP | 2002-324680 A | 11/2002 |
| WO | WO 00/70655 A2 | 11/2000 |
| WO | WO 01/41512 A1 | 6/2001 |

* cited by examiner

*Primary Examiner*—D. Lawrence Tarazano
*Assistant Examiner*—Camie S Thompson
(74) *Attorney, Agent, or Firm*—Sughrue Mion, PLLC

(57) ABSTRACT

An organic electroluminescence element has an anode, a hole transport layer, a light emitting layer made of organic compounds, an electron transport layer and a cathode. The light emitting layer comprises an organic host material having an electron transport capability and an organic guest material of phosphorescent material. An ionization potential energy of the organic host material is higher than that of the hole transport layer. The difference in the ionization potential energy between the organic host material of the light emitting layer and the hole transport layer is in a range from 0.4 eV to 0.8 eV.

4 Claims, 3 Drawing Sheets

ORGANIC ELECTROLUMINESCENCE ELEMENT

BACKGROUND OF THE INVENTION

1. Technical Field

The present invention relates to an organic electroluminescence element (hereinafter also referred to as the "organic EL element") which utilizes the electroluminescence (hereinafter also referred to as the "EL") of organic compounds which emit light in response to a current injected thereinto, and has a light emitting layer formed of a laminate of such materials.

2. Description of the Related Art

Generally, each of the organic EL elements constituting a display panel using organic materials comprises an anode as a transparent electrode, a plurality of organic material layers including an organic light emitting layer, and a cathode comprised of a metal electrode, which are laminated as thin films in this order on a glass substrate as a display surface. The organic material layers include, in addition to the organic light emitting layer, a layer of a material having the hole transport capability such as a hole injection layer and a hole transport layer, a layer of a material having the electron transport capability such as an electron transport layer and an electron injection layer, and so on. Organic EL elements comprising these layers are also proposed. The electron injecting layer also contains an inorganic compound.

As an electric field is applied to the laminate organic EL element including an organic light emitting layer and an electron or hole transport layer, the holes are injected from the anode, while electrons are injected from the cathode. The electrons and the holes are recombined in the organic light emitting layer to form excitons. The organic EL element utilizes light which is emitted when the excitons return to a base state. In some cases, a pigment may be doped into the light emitting layer for improving the efficiency of light emission and stably driving the element.

Recently, it is suggested that phosphorescent materials are used for the light emitting layer of the organic EL element in addition to fluorescent materials.

It is expected that the ratio of production of singlet and triplet excited states is 1:3 because the EL element using phosphorescence may achieve an high light efficiency as three or four times of the device using fluorescence.

On the other hand, for improving the low power consumption nature, light emission efficiency, and driving stability of the organic EL element, it has been proposed to provide a hole blocking layer between the organic light emitting layer and the cathode for limiting the migration of holes from the organic light emitting layer. Efficient accumulation of holes in the light emitting layer with the aid of the hole blocking layer can result in an improved recombination probability with electrons, and a higher light emission efficiency. A report has been made that single use of a phenanthroline derivative or a triazole derivative is effective as a hole blocking material (see Japanese Patent Application Kokai Nos. Hei 8-109373 and Hei 10-233284).

There is an organic EL element utilizing emission of phosphorescence. The conventional organic EL element comprises a light emitting layer including a material having a hole transport capability as a host material; and a hole blocking layer disposed at the side of the cathode adjacent to the light emitting layer and having an ionization potential energy higher than that of the light emitting layer's host material, for example, a phenanthroline derivative such as 2,9-dimethyl-4,7-diphenyl-,1,10-phenathroline: BCP, or an aluminum chelate such as ((1,1'-biphenyl)-4-olato)bis(2-methyl-8-quinolinolato N1, O8) aluminum: BAlq. When BCP is used for the hole blocking layer, there is a drawback in that the driving lifetime of the organic EL element is very short although the early emission property thereof is good. There is no material for the hole blocking layer having both of an excellent durability and a high ionization potential energy enough to block holes in the actual situation at the present time.

Although BAlq has an excellent durability but not a sufficient hole blocking capability because of a less than a high ionization potential energy. In fact, when an organic EL element utilizing the hole blocking layer of BAlq and the electron transport layer of tris(8-hydroxyquinolato N1, O8) aluminum: Alq3 is driven, the electron transport layer emits green light. If such an organic EL element utilizes phosphorescence for red emission, the green light emitted from Alq3 influences chromatic deterioration itself so that red emission changes into orange.

While the provisions of an organic phosphorescent material light emitting layer and a hole blocking layer is effective for increasing the light emission efficiency of the organic EL element, a longer lifetime of the element is required. There is a need for a highly efficient organic electroluminescence element which continuously emits light at a high luminance with a less current.

OBJECT AND SUMMARY OF THE INVENTION

It is an object of the present invention to provide an organic EL element having effectiveness in prolonging life time.

An organic electroluminescence element according to the present invention comprises: an anode, a hole transport layer, a light emitting layer made of organic compounds, an electron transport layer and a cathode, characterized in that said light emitting layer comprises an organic host material having an electron transport capability and an organic guest material of phosphorescent material;

in that an ionization potential energy of said organic host material is higher than that of said hole transport layer; and in that the difference in the ionization potential energy between said organic host material of said light emitting layer and said hole transport layer is in a range from 0.4 eV to 0.8 eV.

In one aspect of the invention, the organic electroluminescence element further includes a hole injecting layer disposed between said anode and said hole transport layer.

In another aspect of the invention, the organic electroluminescence element further includes an electron injecting layer disposed between said cathode and said electron transport layer.

In a further aspect of the organic electroluminescence element of the invention, said hole transport layer comprises a triphenylamine derivative, said organic host material comprises an aluminium chelate complex represented by a general formula (A)

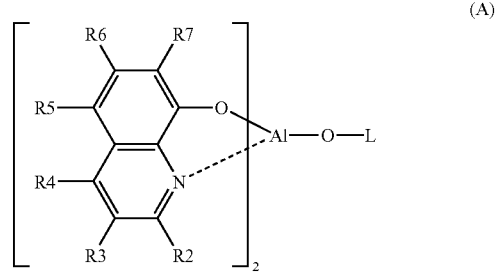

(A)

wherein R2 denotes an alkyl, oxy, amino or hydrocarbon substituent having at least 1 carbon atom, carbon atom being 1 to 10 in any one hydrocarbon moiety, R3 to R7 independently denote a hydrogen atom, alkyl, oxy, amino or hydrocarbon substituent having at least 1 carbon atom, carbon atom being 1 to 10 in any one hydrocarbon moiety, R5, R6 and R7 are selected from a group comprises of cyano, halogen, and α-haloalkyl, α-haloalkoxy, amido, sulfonyl, carbonyl, carbonyloxy and oxycarbonyl substituents containing up to 10 carbon atoms, L denotes one of formulae (B) represented below

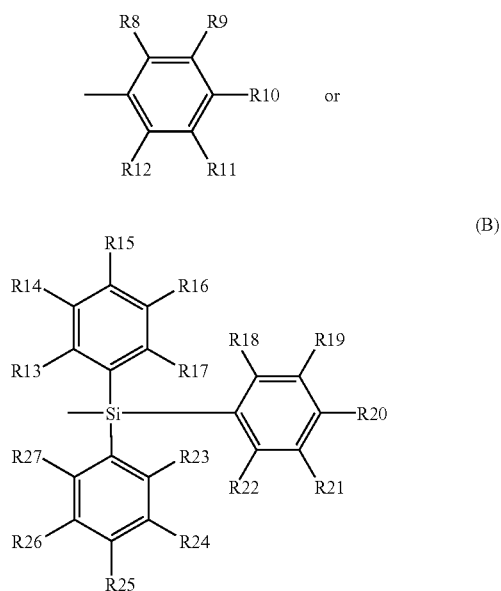

(B)

wherein R8 to R12 independently represent hydrogen or hydrocarbon groups of from 1 to 12 carbon atoms, with the proviso that R8 and R9 together or R9 and R10 together can form a fused benzo ring, R13 to R27 independently represent hydrogen or hydrocarbon groups of from 1 to 12 carbon atoms, with the proviso that R13 and R14 or R14 and R15 can form a fused benzo ring, R18 and R19 or R19 and R20 can form a fused benzo ring, and R23 and R24 or R24 and R25 can form a fused benzo ring.

In a still further aspect of the organic electroluminescence element of the invention, said hole transport layer comprises 4,4'bis(N-(naphthyl)-N-phenyl-amino)biphenyl, said organic host material comprises ((1,1'-biphenyl)-4-olato)bis(2-methyl-8-quinolinolato Nl, O8) aluminum.

In a still further aspect of the organic electroluminescence element of the invention, said hole transport layer comprises 4,4'bis(N-(naphthyl)-N-phenyl-amino)biphenyl, said organic host material comprises bis(2-methyl-8-hydroxyquinolinato) gallium chloride.

DETAILED DESCRIPTION OF THE PREFERRED EMBODIMENTS

An embodiment of the present invention will hereinafter be described with reference to the accompanying drawings.

Figure 1:
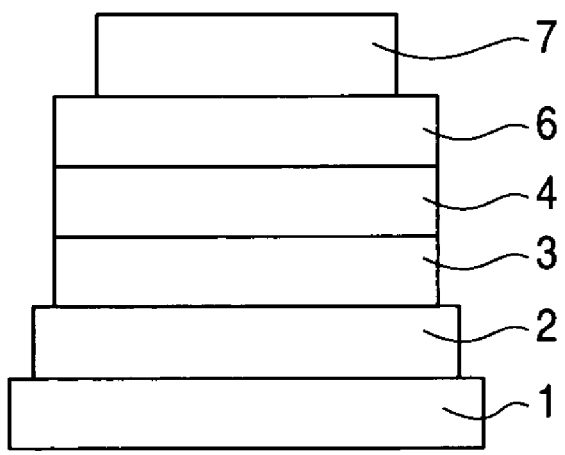
FIGS. 1 to 3 are cross-sectional diagrams each schematically illustrating an organic EL element in embodiments according to the present invention.

An organic EL element according to the present invention basically comprises an anode 2, a hole transport layer 3, a light emitting layer 4, an electron transport layer 6 and a cathode 7 as illustrated in FIG. 1. For example, a transparent anode 2; a hole transport layer 3 made of an organic compound; a light emitting layer 4 made of an organic compound; an electron transport layer 6 made of an organic compound; and a cathode 7 made of a metal having a low work function are laminated in this order on a transparent substrate 1 such as glass, so that an organic EL element is completed. The light emitting layer 4 of the organic EL element according to the embodiment of the present invention comprises of an organic host material made of at least one organic compound having an electron transport capability and a guest material made of at least one organic phosphorescent material doped into the host material. The organic host material of the light emitting layer 4 has an ionization potential energy (Ip) higher than that of the organic compound used for the hole transport layer 3 so that the difference in the ionization potential energy between the organic host material of the light emitting layer 4 and the hole transport layer 3 is in a range from 0.4 eV to 0.8 eV. In the light emitting layer 4, one of the organic guest materials is preferably doped in a proportion ranging from 4 to 10% in weight percentage to all materials contained therein.

In a concrete example of the organic EL element, the anode is made of ITO; the hole transport layer is made of 4,4'bis(N-(naphthyl)-N-phenyl-amino)biphenyl: NPB (Ip=5.4 eV); the host material of the light emitting layer is made of ((1,1'-biphenyl)-4-olato)bis(2-methyl-8-quinolinolato Nl, O8) aluminum: BAlq (Ip=5.9 eV); and the electron transport layer is made of Alq3; and the cathode is made of aluminum.

Figure 2:
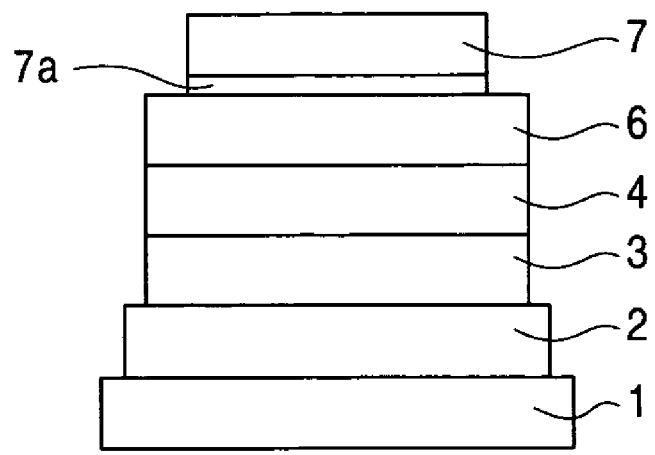

In addition to the foregoing structure, another organic EL element may have a structure which includes an electron injecting layer 7a of $Li_2O$ or the like laminated or deposited as a thin film between the electron transport layer 6 and the cathode 7, as illustrated in FIG. 2.

Figure 3:
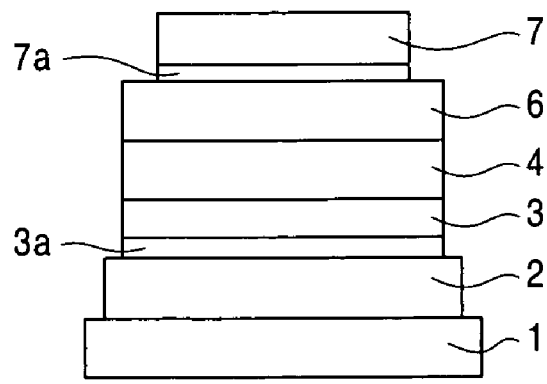

In addition to the structure of the organic EL element above mentioned, other embodiments include an organic EL element further comprising a hole injecting layer 3a disposed between the anode 2 and the hole transport layer 3 as shown in FIG. 3. The hole injecting layer 3a may be made of copper phthalocyanine (so-called CuPc) included in porphyrin derivatives having a hole transport capability.

As the cathode 7, there may be used a metal which has a small work function, for example, aluminum, magnesium, indium, silver, and alloys thereof, and a thickness in a range of approximately 100 to 5000 angstroms. Also, as the anode 2, there may be mentioned a conductive material which has a large work function, for example, indium tin oxide (hereinafter abbreviated as "ITO"), and a thickness in a range of approximately 300 to 3000 angstroms, or gold of approximately 800 to 1500 angstroms in thickness. It should be noted that when gold is used as an electrode material, the electrode is translucent. Either the cathode or the anode may be transparent or translucent.

In the embodiments, the substance contained in the hole transport layer 3 having the hole transport capability may be selected from materials represented by the following chemical formulae (1)-(26) including triphenylamine derivatives.

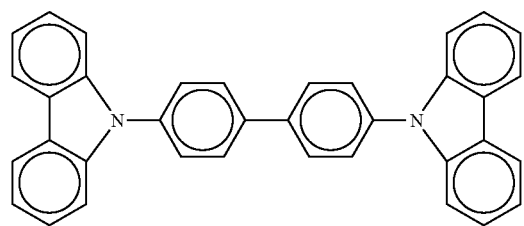
(1)
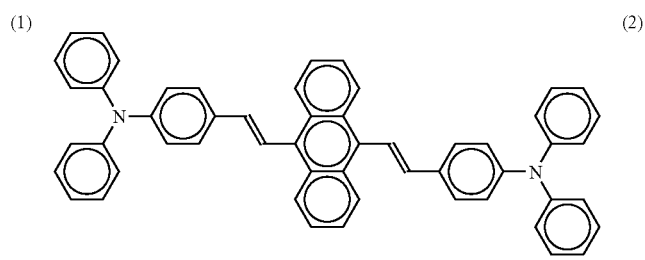
(2)
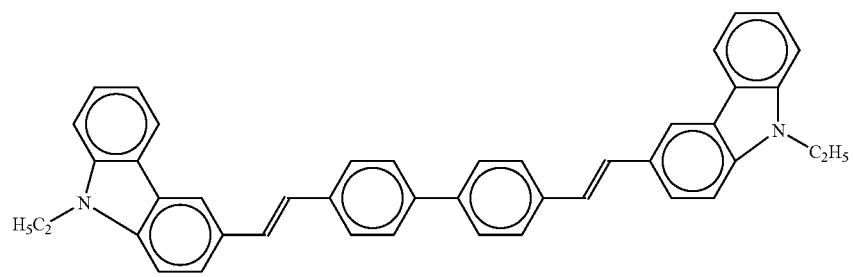
(3)
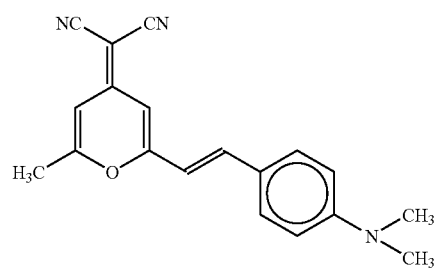
(4)
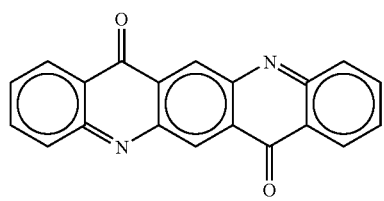
(5)
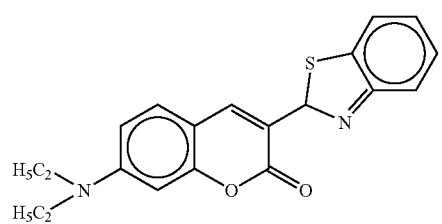
(6)
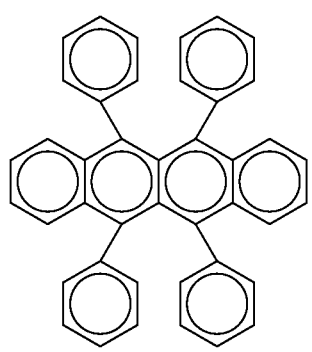
(7)
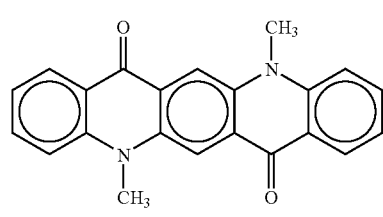
(8)
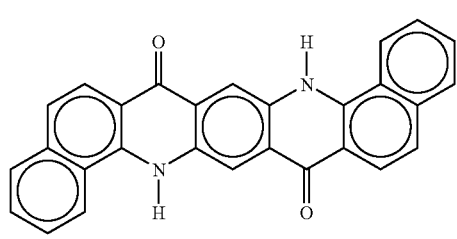
(9)

-continued
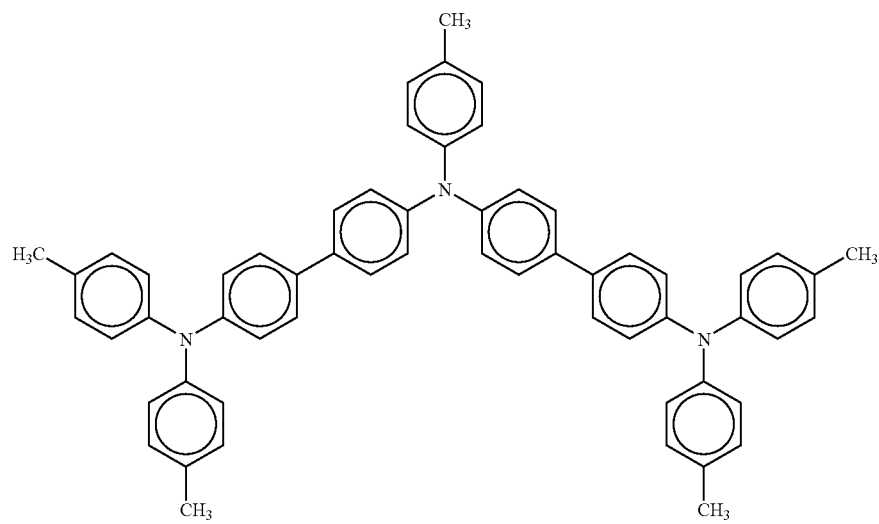
(10)
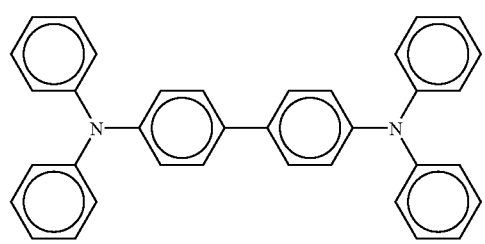
(11)
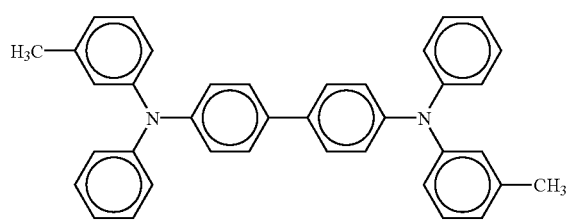
(12)
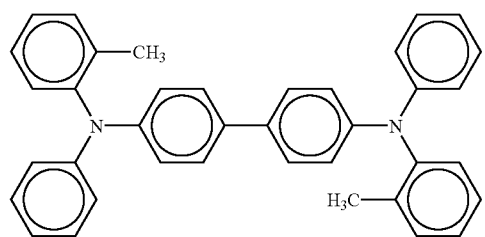
(13)
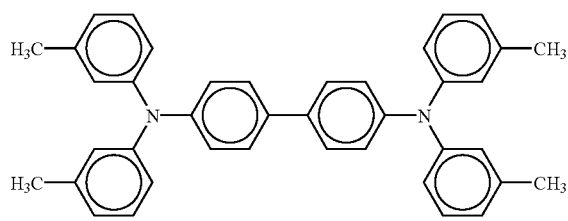
(14)
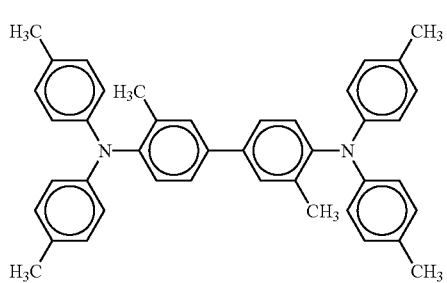
(15)
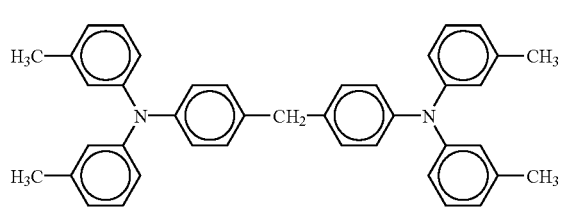
(16)
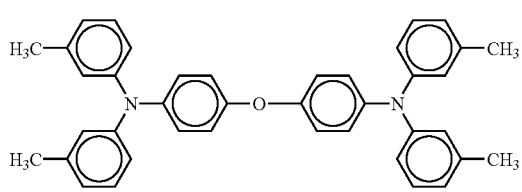
(17)
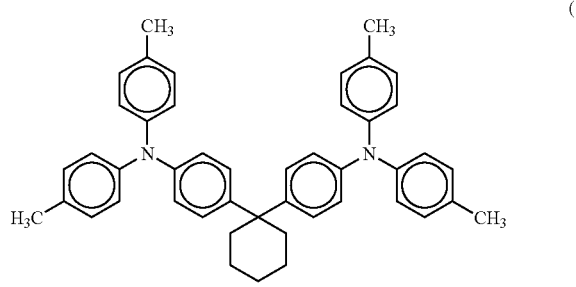
(18)

-continued
(19)
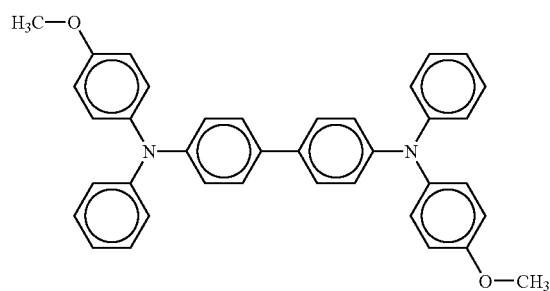
(20)
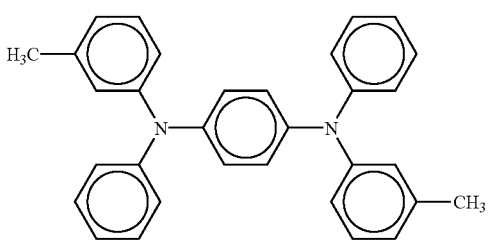
(21)
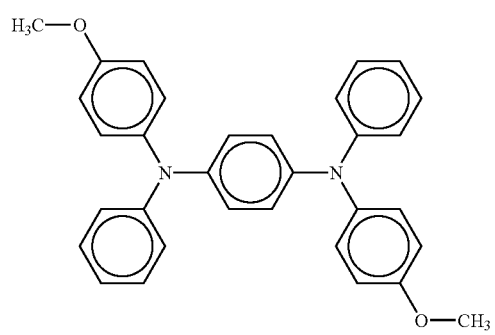
(22)
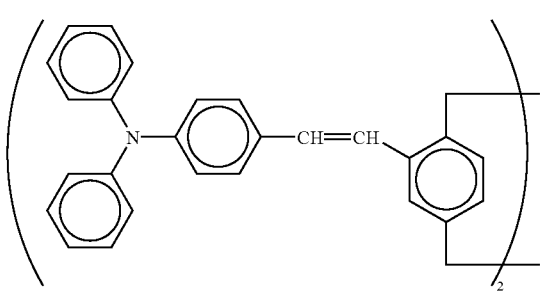
(23)
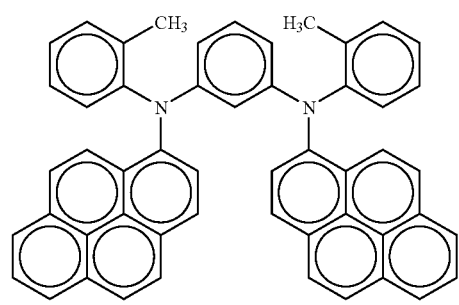
(24)
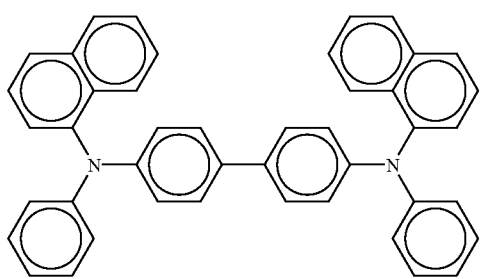
(25)
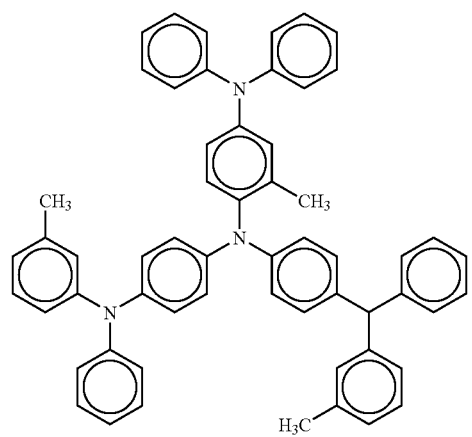
(26)
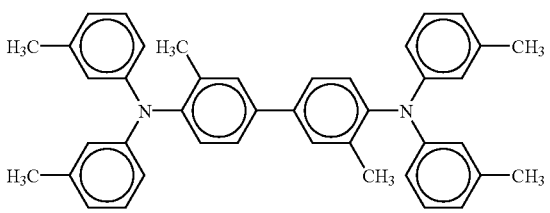

The organic host material having the electron transport capability which is a major component of the light emitting layer 4 is selected as a material whose ionization potential (Ip) is higher than that of the organic compound of the hole transport layer 3 by a difference ranging from 0.4 eV to 0.8 eV. Such an organic host material may be selected from materials represented by the following chemical formulae (27)-(45).

(27)
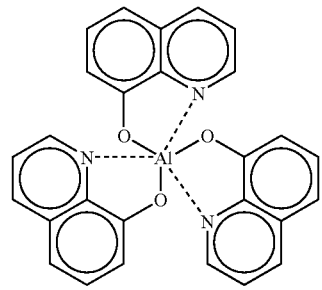

(28)
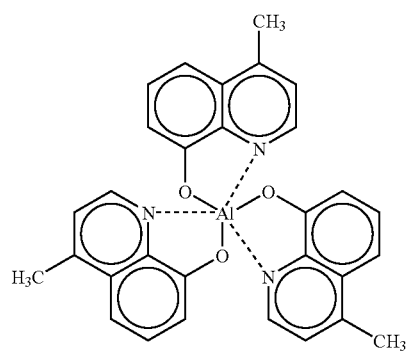

(29)
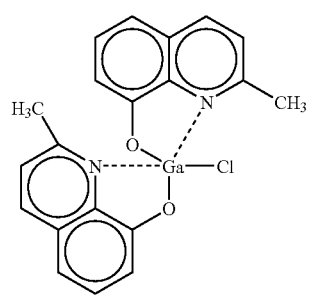

(30)
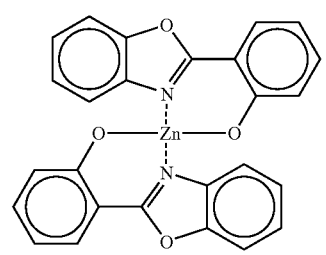

(31)
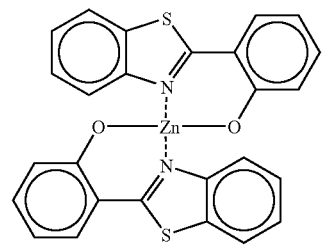

(32)
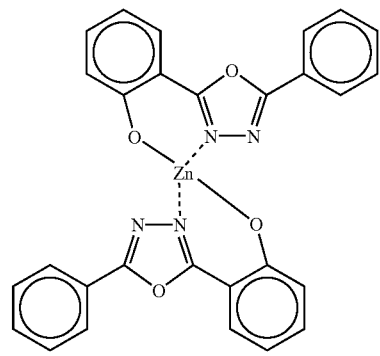

(33)
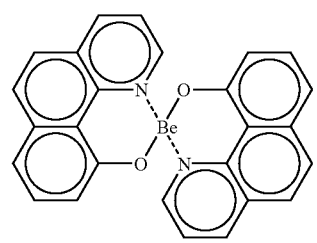

(34)
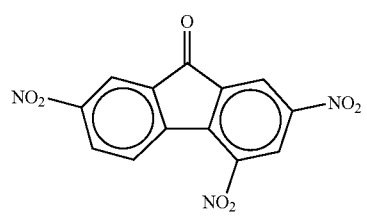

-continued
(35)
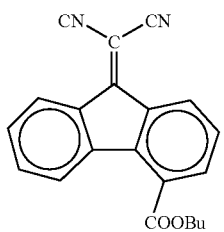
(36)
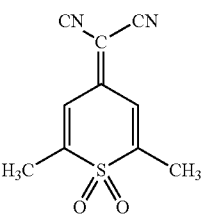
(37)
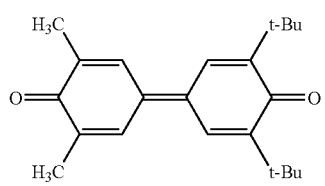
(38)
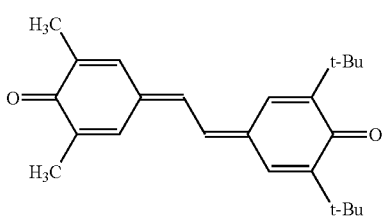
(39)
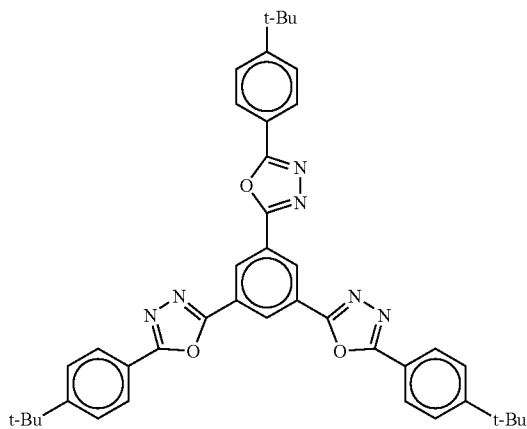
(40)
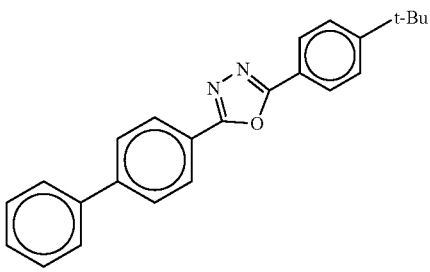
(41)
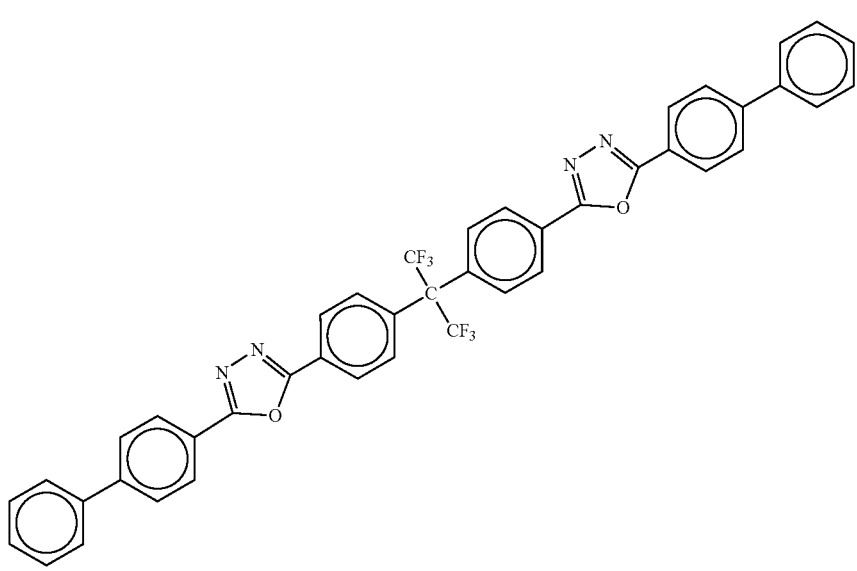

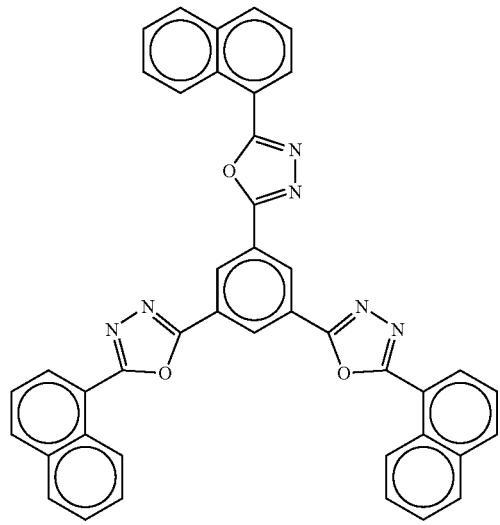
(42)

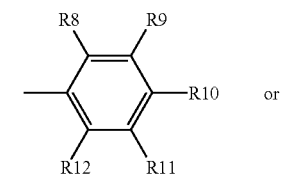
(43)

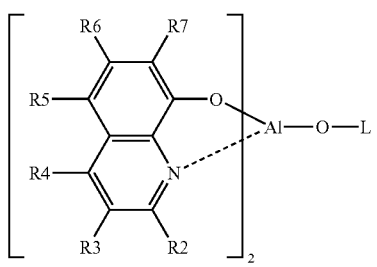
(44)

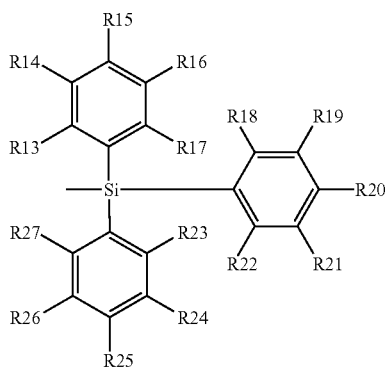
(45)

In the above formulae, Bu represents a butyl group; and t-Bu represents a tert-butyl group.

In the embodiments, the organic host material contained in the light emitting layer 4 having the electron transport capability also may be selected from aluminium chelate complexes or coordination complexes represented by a general formula (A)

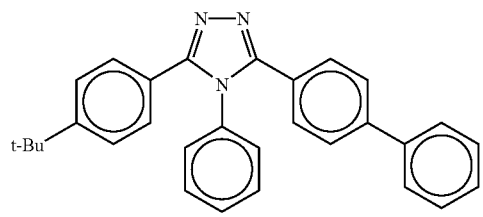
(A)

wherein R2 denotes an alkyl, oxy, amino or hydrocarbon substituent having at least 1 carbon atom, carbon atom being 1 to 10 in any one hydrocarbon moiety, R3 to R7 independently denote a hydrogen atom, alkyl, oxy, amino or hydrocarbon substituent having at least 1 carbon atom, carbon atom being 1 to 10 in any one hydrocarbon moiety, R5, R6 and R7 are selected from a group comprises of cyano, halogen, and α-haloalkyl, α-haloalkoxy, amido, sulfonyl, carbonyl, carbonyloxy and oxycarbonyl substituents containing up to 10 carbon atoms, L denotes one of formulae (B)

wherein R8 to R12 independently represent hydrogen or hydrocarbon groups of from 1 to 12 carbon atoms, with the proviso that R8 and R9 together or R9 and R10 together can form a fused benzo ring, R13 to R27 independently represent hydrogen or hydrocarbon groups of from 1 to 12 carbon atoms, with the proviso that R13 and R14 or R14 and R15 can form a fused benzo ring, R18 and R19 or R19 and R20 can form a fused benzo ring, and R23 and R24 or R24 and R25 can form a fused benzo ring.

In the aluminum chelates whose ionization potential (Ip) is higher than that of the organic compound of the hole transport layer 3 by a difference ranging from 0.4 eV to 0.8 eV, the organic host material may be selected from materials represented by the following chemical formulae (46)-(81).

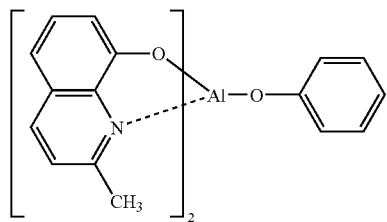
(46)

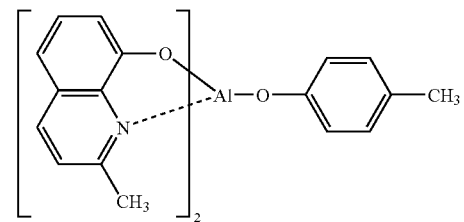
(47)

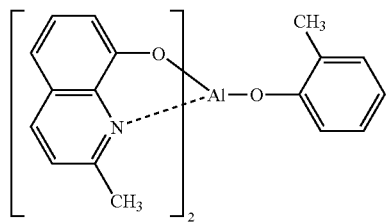
(48)

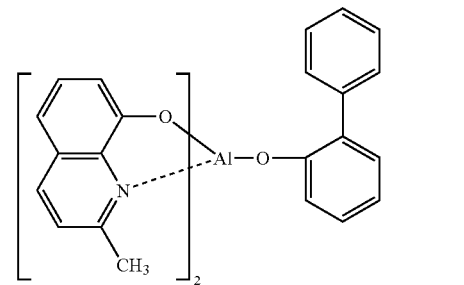
(49)

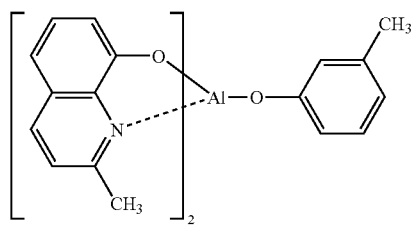
(50)

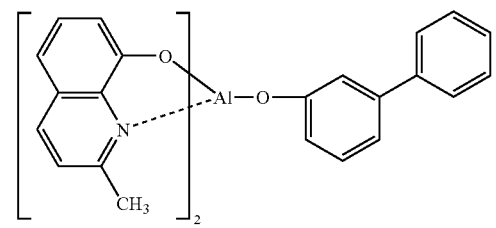
(51)

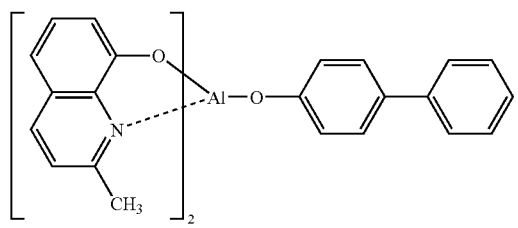
(52)

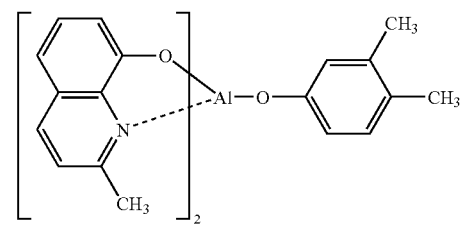
(53)

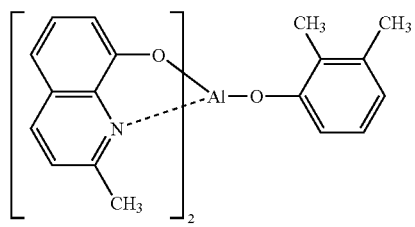
(54)

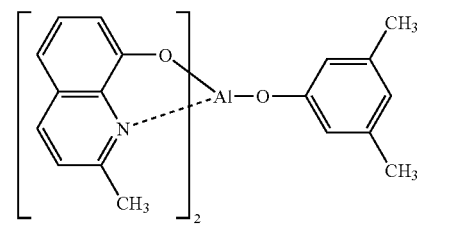
(55)

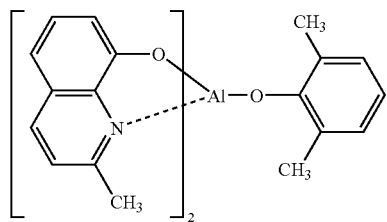
(56)

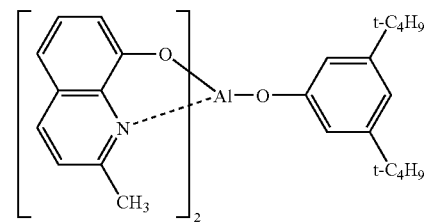
(57)

-continued
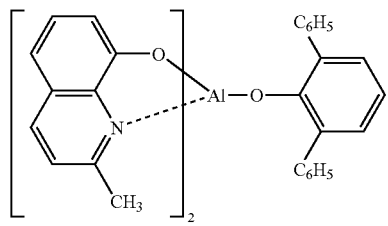
(58)
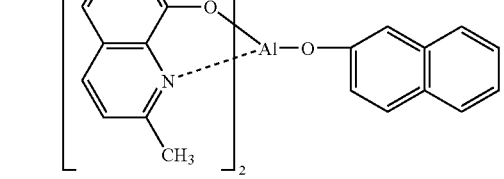
(59)
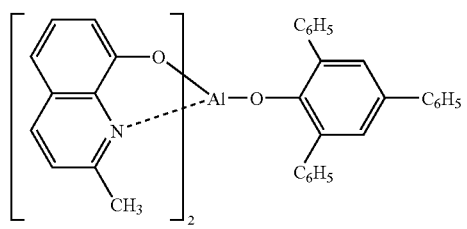
(60)
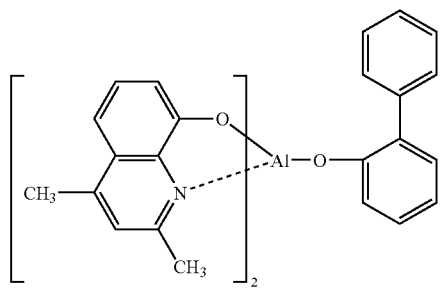
(61)
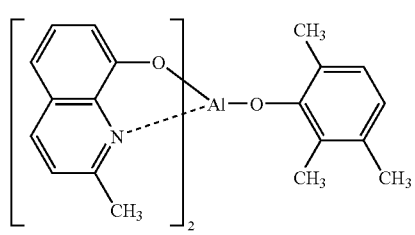
(62)
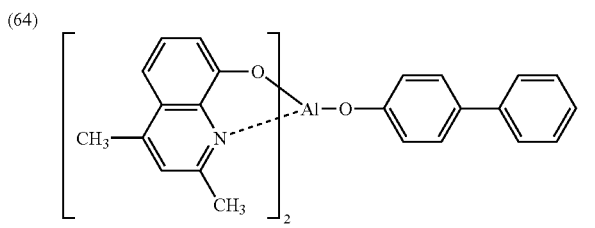
(63)
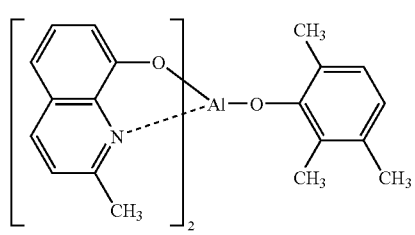
(64)
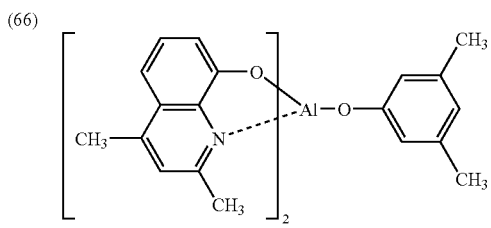
(65)
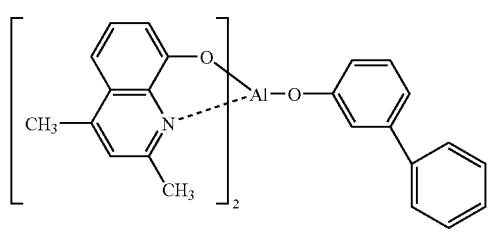
(66)
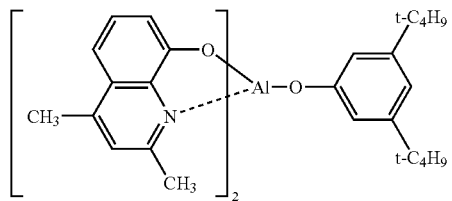
(67)
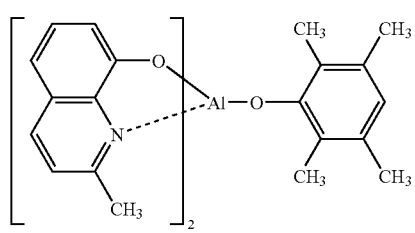
(68)
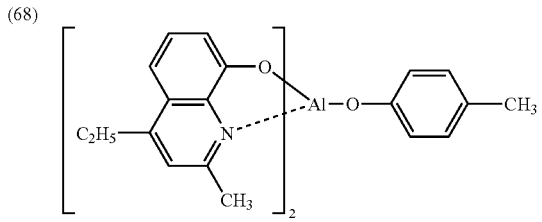
(69)

-continued
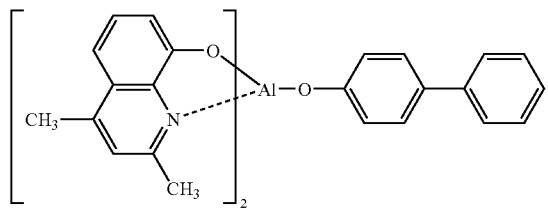 (70)
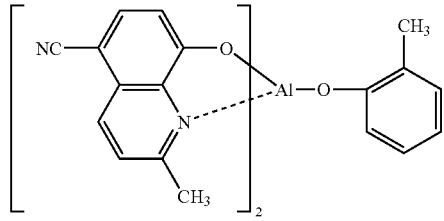 (71)
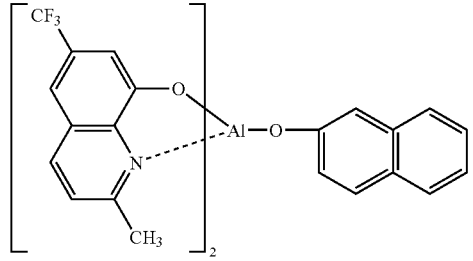 (72)
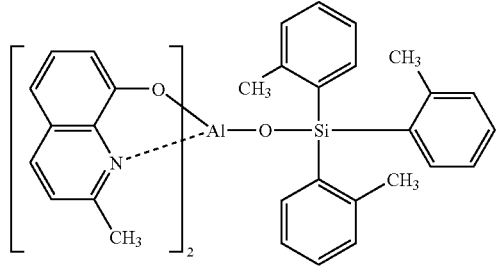 (73)
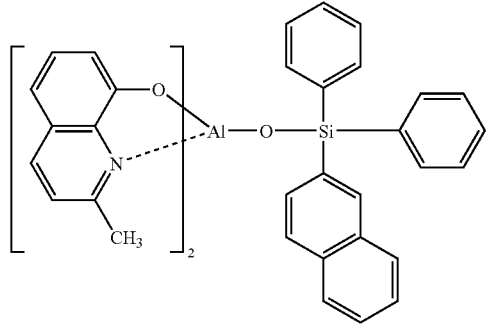 (74)
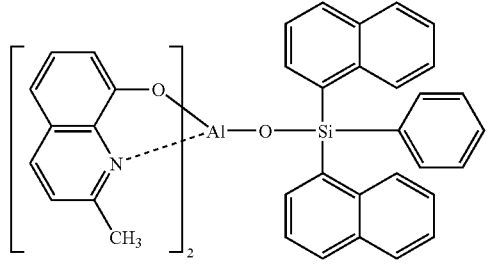 (75)
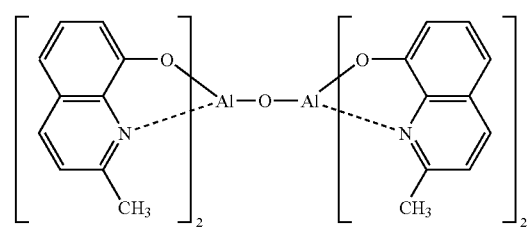 (76)
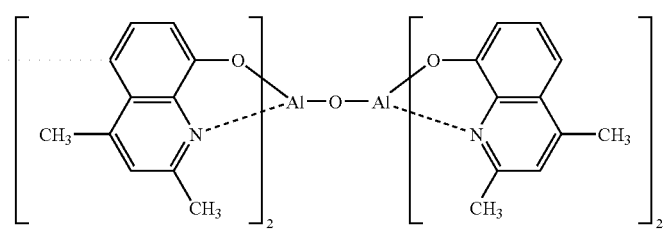 (77)
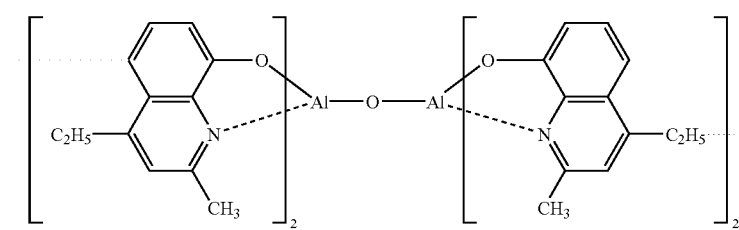 (78)

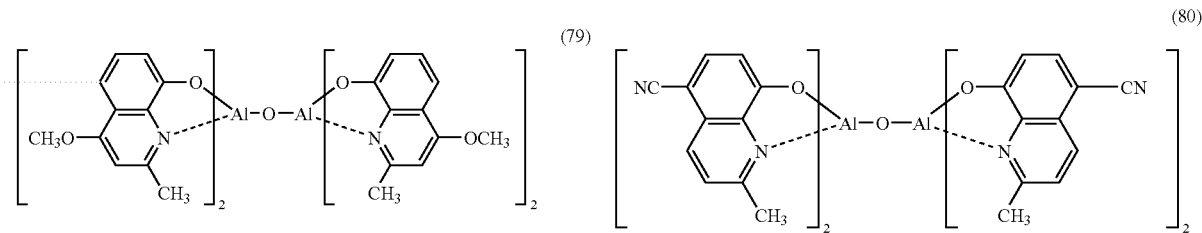
(79)
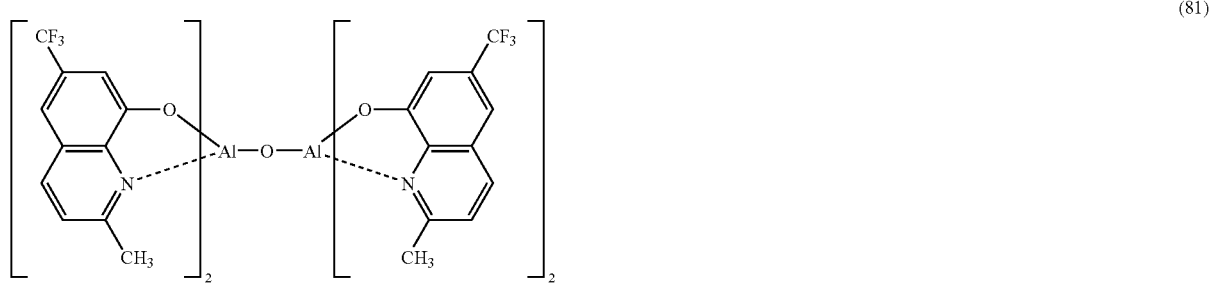
(80)
(81)
In further embodiments, the organic host material contained in the light emitting layer 4 having the electron transport capability also may be selected from materials represented by the following chemical formulae (82)-(90) or phenanthroline derivatives.
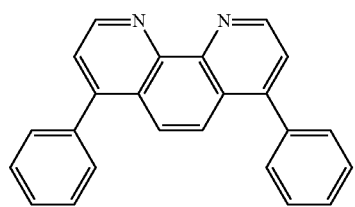
(82)
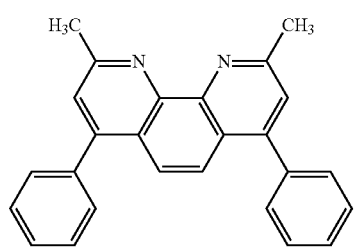
(83)
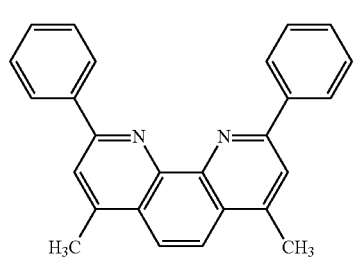
(84)
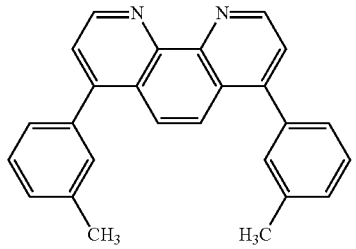
(85)
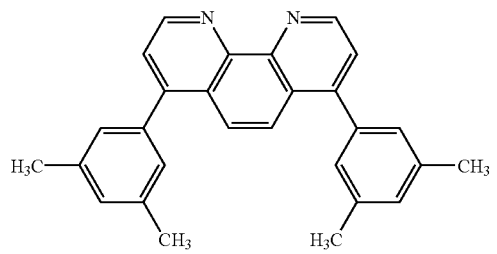
(86)
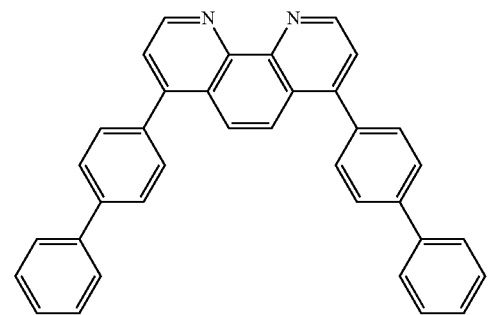
(87)

-continued

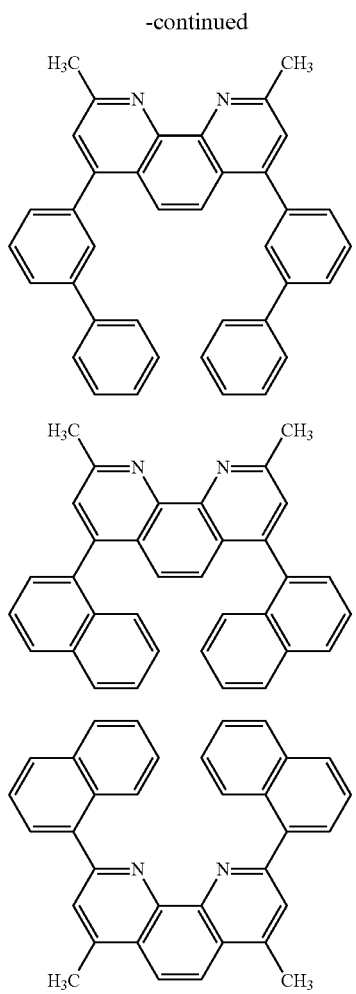

(88)

(89)

(90)

The organic guest material of phosphorescence included in the light emitting layer 4 is, for example, 2,3,7,8,12,13,17,18-octaethyl-21H,23H-porphine platinum (II), tris(2-phenylpyridine)iridium, bis(2-(2'-benzo[4,5-α] thienyl)pyridinato-N, C3)iridium and the like.

In the embodiments, the substance used for the electron transport layer 6 may be selected from the foregoing organic compound materials represented for the organic host material having the electron transport capability.

EXPERIMENT 1

Samples of several organic EL elements were specifically made for evaluating the characteristics thereof.

The respective samples were manufactured in such a manner that NPB is used for each hole transport layer, and Alq3 is used for each electron transport layer, and in that various host materials were used for the respective light emitting layers. The respective thin films of Samples or embodiments were laminated on a glass substrate formed with an anode made of ITO having a thickness of 1100 Å by a vacuum deposition method at the degree of vacuum of $5.0 \times 10^{-6}$ Torr.

First, for Sample 1, NPB was formed in a thickness of 800 Å on the ITO anode as a hole transport layer at the deposition rate of 3 Å/sec.

Next, a host material of Alq3 and a guest material of red phosphorescent substance (hereinafter referred to as the "Dopant A") were co-evaporated from different evaporation sources in a thickness of 475 Å on the hole transport layer as a light emitting layer. In this event, the concentration of Dopant A in the light emitting layer was 7 wt. %.

Subsequently, on the light emitting layer, Alq3 was deposited as an electron transport layer in a thickness of 300 Å at the deposition rate of 3 Å/sec.

Further, on the electron transport layer, lithium oxide ($Li_2O$) was deposited as an electron injecting layer in a thickness of 5 Å at the deposition rate of 0.1 Å/sec, and then aluminum (Al) was laminated on the electron injecting layer as an electrode in a thickness of 1000 Å at the rate of 10 Å/sec to complete an organic light emitting element of Sample 1.

Another organic EL element of Sample 1 was also manufactured in a similar manner to Sample 1 except that the light emitting layer and the electron transport layer were formed in thicknesses of 625 Å and 150 Å respevtively.

Furthermore, Samples 2-5 were also manufactured in a similar manner to Sample 1 except that various host materials light were used for the emitting layers. The following Table 1 shows the host materials of the emitting layers, the layered structure (LS) of thickness, chromaticity coordinates (CHRO), luminance (LU), quantum yield (QY) and driving voltage (DV) corresponding to Samples 1-5 together with ionization potential energy (Ip).

TABLE 1

| | HOST | LS(Å) | | | CHRO | | LU | QY | DV |
|---|---|---|---|---|---|---|---|---|---|
| | (Ip) | NPB/ | HOST + A | /Alq3 | CIEx | CIEy | cd/m² | % | V |
| 1 | Alq3 | 800/ | 475 | /300 | 0.68 | 0.31 | 45 | 2.4 | 4.3 |
| | (5.7 eV) | 800/ | 625 | /150 | 0.68 | 0.32 | 44 | 2.3 | 4.4 |
| 2 | BAlq | 800/ | 475 | /300 | 0.68 | 0.32 | 171 | 8.2 | 6.4 |
| | (5.9 eV) | 800/ | 625 | /150 | 0.68 | 0.32 | 182 | 8.7 | 7.1 |
| 3 | GaqMe₂Cl | 800/ | 475 | /300 | 0.68 | 0.32 | 168 | 8.2 | 6.3 |
| | (6.1 eV) | 800/ | 625 | /150 | 0.68 | 0.32 | 171 | 8.5 | 7.1 |
| 4 | BCP | 800/ | 475 | /300 | 0.68 | 0.32 | 140 | 6.6 | 5.2 |
| | (6.4 eV) | 800/ | 625 | /150 | 0.68 | 0.32 | 139 | 6.6 | 5.5 |
| 5 | OXD-7 | 800/ | 475 | /300 | 0.68 | 0.32 | 67 | 3.1 | 4.1 |
| | (6.5 eV) | 800/ | 625 | /150 | 0.68 | 0.32 | 66 | 3.1 | 4.2 |

The light emitting layer of Sample 1 contains the host material of Alq3 (Ip=5.7 eV). In this Sample, since the difference in the ionization potential energy between NPB and Alq3 is smaller than 0.4 eV, so that holes easily pass through the light emitting layer to reduce the generation efficiency for excitons. Therefore, the emission efficiency of this sample is insufficient.

With respect to Samples 2 and 3, the light emitting layer of Sample 2 contains the host material of BAlq (Ip=5.9 eV). The light emitting layer of Sample 3 contains the host material of (2-methyl-8-hydroxyquinolinato) gallium chloride: GaqMe2Cl (Ip=6.1 eV). Both the Samples have excellent emission efficiencies. In comparison with Samples having the light emitting layers with thicknesses of 475 Å and 625 Å in Samples 2 and 3 respectively, the 625 Å samples have high values in the luminance and the quantum yield. As seen from this fact, it is estimated that the emission region in the light emitting layer lies at least 475 Å or more in thickness.

The light emitting layer of Sample 4 contains the host material of BCP (Ip=6.4 eV). The light emitting layer of Sample 5 contains the host material of 1,3-bis(2-(4tert-butylphenyl)-1,3,4-oxadiazol-5-yl)benzene: OXD-7 (Ip=6.5 eV). In both the Samples 4 and 5, since the difference in the ionization potential energy between NPB and the host material is larger than 0.8 eV, the emission efficiencies of these samples are insufficient. Therefore, it is assumed that such a large difference of ionization potential energy between NPB and the host material restricts the emission region adjacent to the interface of NPB in the light emitting layer. Since NPB serves as a deactivator for phosphorescence (triplet excitons), Samples 4 and 5 have low values in the luminance and the quantum yield in comparison with Samples 2 and 3.

Since NPB has ionization potential energy of 5.4 eV, Samples 2 and 3 correspond to the embodiment of the present invention, and Samples 1, 4 and 5 correspond to the Comparatives.

EXPERIMENT 2

For another embodiment, a NPB hole transport layer (600 Å thick), a light emitting layer having BAlq host material and Dopant A (300 Å thick), an Alq3 electron transport layer (650 Å thick), a Li$_2$O electron injecting layer (5 Å thick), and an Al electrode 1000 Å were in turn layered on the ITO anode formed on a substrate to complete an organic EL element. This embodiment is hereinafter abbreviated as "Host:BAlq element".

For Comparative 1, a NPB hole transport layer (600 Å thick), a light emitting layer having CBP host material and Dopant A (300 Å thick), a BCP hole blocking layer (100 Å thick), an Alq3 electron transport layer (650 Å thick), a Li$_2$O electron injecting layer (5 Å thick), and an Al electrode 1000 Å were in turn layered on the ITO anode formed on a substrate to complete an organic EL element. The Comparative 1 is hereinafter abbreviated as "HBL:BCP element". In addition, the CBP host material in the light emitting layer is 4,4'N,N'-dicarbazol-biphenyl. Furthermore, Comparative 2 of an organic EL element was manufactured in a similar manner to Comparative 1 except that the BCP hole blocking layer (100 Å thick) was replaced with a BAlq hole blocking layer (100 Å thick). The Comparative 2 is hereinafter abbreviated as "HBL:BAlq element".

Figure 4:
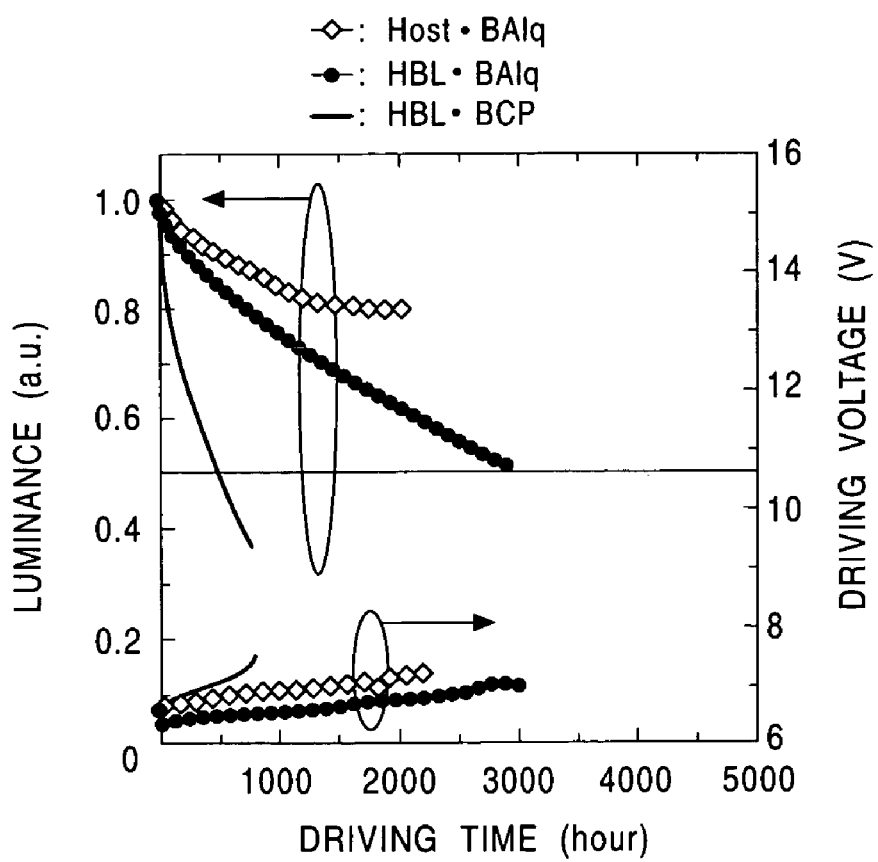
FIGS. 4 and 5 are graphs each showing a luminance property vs. passage of driving time of the EL element of the embodiment according to the present invention.

The following Table 2 shows luminance properties of the embodiment of Host:BAlq element, Comparative 1 of HBL:BCP element and Comparative 2 of HBL:BAlq element. In addition, FIG. 4 shows the driving lifetime characteristics of the foregoing elements under the condition of application of 2.5 mA/cm$^2$.

TABLE 2

|  | CHRO | | LU | QY | DV |
|---|---|---|---|---|---|
|  | CIEx | CIEy | cd/m$^2$ | % | V |
| Host:BAlq | 0.680 | 0.319 | 179.1 | 8.55 | 6.51 |
| HBL:BCP | 0.683 | 0.317 | 204.0 | 10.76 | 6.52 |
| HBL:BAlq | 0.662 | 0.328 | 202.0 | 9.60 | 6.21 |

As apparent from Table 2, the Host:BAlq element is inferior to Comparative by 10% in the emission efficiency (quantum yield). However, as apparent from FIG. 4, the Host:BAlq element has the driving lifetime about 20 times as large as Comparative 1 of the HBL:BCP element having the BCP hole blocking layer. Also, the Host:BAlq element has the driving lifetime about 3 times as large as Comparative 2 of the HBL:BAlq element having the BAlq hole blocking layer.

Experiment 3

A further embodiment of an organic EL element was manufactured as a second Host:BAlq element in a similar manner to the Host:BAlq element except that red phosphorescent material of 2,3,7,8,12,13,17,18-octaethyl-21H,23H-porphine platinum (II) (hereinafter referred to as the "Dopant B") was used instead of Dopant A. Namely, the second Host:BAlq element was manufactured in a manner that a NPB hole transport layer (900 Å thick), a light emitting layer having BAlq host material and Dopant B (325 Å thick), an Alq3 electron transport layer (550 Å thick), a Li$_2$O electron injecting layer (5 Å thick), and an Al electrode 1000 Å were in turn layered on the ITO anode formed on a substrate.

Furthermore, a still further embodiment of an organic EL element was also manufactured in a similar manner to the second Host:BAlq element except that a host material is GaqMe2Cl used in Sample 3 of EXPERIMENT 1 and a guest material is Dopant B. This embodiment is hereinafter abbreviated as "Host:GaqMe2Cl element". Namely, the Host:GaqMe2Cl element was manufactured in a manner that a NPB hole transport layer (900 Å thick), a light emitting layer having GaqMe2Cl host material and Dopant B (325 Å thick), an Alq3 electron transport layer (550 Å thick), a Li$_2$O electron injecting layer (5 Å thick), and an Al electrode 1000 Å were in turn layered on the ITO anode formed on a substrate.

In addition, Comparative 3 of an organic EL element was manufactured in such a manner that the hole blocking layer provided between the light emitting layer and the electron transport layer. Namely, the Comparative 3 was manufactured in a manner that a NPB hole transport layer (600 Å thick), a light emitting layer having CBP host material and Dopant B (300 Å thick), a BCP hole blocking layer (100 Å thick), an Alq3 electron transport layer (650 Å thick), a Li$_2$O electron injecting layer (5 Å thick), and an Al electrode 1000 Å were in turn layered on the ITO anode formed on a substrate. This Comparative 3 is hereinafter abbreviated as "HBL:BCP element". Furthermore, Comparative 4 of an organic EL element was manufactured in a similar manner to Comparative 3 except that the BCP hole blocking layer was replaced with a BAlq hole blocking layer. The Comparative 4 is hereinafter abbreviated as "HBL:BAlq element".

The following Table 3 shows luminance properties of the embodiments of Host:BAlq element and Host:GaqMe2Cl element and Comparative 3 of HBL:BCP element and Comparative 4 of HBL:BAlq element.

TABLE 3

|  | CHRO | | LU | QY | DV |
|---|---|---|---|---|---|
|  | CIEx | CIEy | cd/m² | % | V |
| Host:BAlq | 0.684 | 0.301 | 50.1 | 5.97 | 7.05 |
| Host:GaqMe2Cl | 0.701 | 0.288 | 42.9 | 5.49 | 7.68 |
| HBL:BCP | 0.72 | 0.28 | 71.5 | 8.46 | 8.29 |
| HBL:BAlq | 0.608 | 0.359 | 95.8 | 7.02 | 8.12 |

As apparent from Table 2, the embodiments of the Host:BAlq element and Host:GaqMe2Cl element had levels of efficiency (quantum yield) reduced by 30% in comparison to Comparatives. However, the embodiments of organic EL elements maintained the level of red emission in NTSC standard coordinates as contrast with Comparatives emitting orange light. Comparative 4 of HBL:BAlq element having the BAlq hole blocking layer has a chromaticity of CIEx=0.608 and CIEy=0.359.

Figure 5:
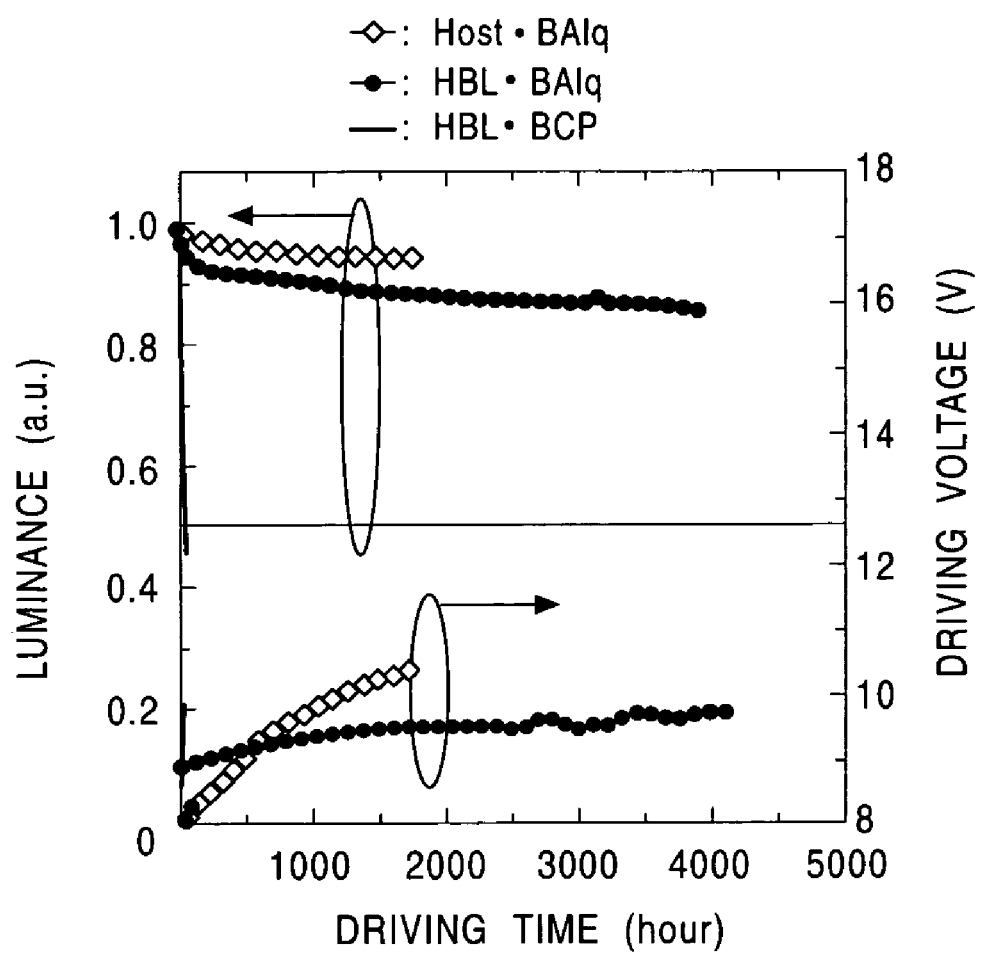

In addition, FIG. 5 shows the driving lifetime characteristics of the embodiment of Host:BAlq element under the condition of application of 7.5 mA/cm², and also, Comparatives 3 and 4 under the condition of application of 5.0 mA/cm². As apparent from FIG. 5, the embodiment of Host:BAlq element comprising the light emitting layer having the BAlq host material has an excellent driving lifetime keeping the 97% initial luminance for 1700 hours.

According to the present invention of the organic EL element utilizing phosphorescence, since the organic host material of the light emitting layer thereof has an ionization potential energy higher than that of the organic compound used for the hole transport layer so that the difference in the ionization potential energy between the organic host material of the light emitting layer and the hole transport layer is in a range from 0.4 eV to 0.8 eV, the organic EL element has a long driving lifetime keeping the luminance characteristics.

According to the present invention, one of evaporation depositing step for the organic layers of the organic EL element may be omitted or the evaporation of the hole blocking layer is unnecessary, although it is necessary and indispensable for the conventional organic EL element the hole blocking layer.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2001-334325 which is hereby incorporated by reference.

What is claimed is:

1. An organic electroluminescence element comprising:
an anode; a hole transport layer; a light emitting layer made of organic compounds; an electron transport layer; and a cathode which are layered in order, wherein the light emitting layer and the electron transport layer are in direct contact with each other without any hole blocking layer provided between the light emitting layer and the electron transport layer,
wherein said light emitting layer comprises an organic host material having an electron transport capability and an organic guest material of phosphorescent material;
wherein an ionization potential energy of said organic host material is higher than that of said hole transport layer;
wherein the difference in the ionization potential energy between said organic host material of said light emitting layer and said hole transport layer is in a range from 0.4 eV to 0.8 eV; and
wherein said organic host material comprises an aluminum chelate complex represented by a general formula (A)

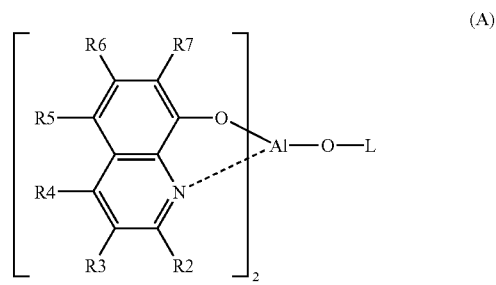

(A)

wherein R2 denotes an alkyl, oxy, amino or hydrocarbon substituent having at least 1 carbon atom, with a carbon atom number being 1 to 10 in any one hydrocarbon moiety, R3 to R7 independently denote a hydrogen atom, alkyl, oxy, amino or hydrocarbon substituent having at least 1 carbon atom, with a carbon atom number being 1 to 10 in any one hydrocarbon moiety, R5, R6 and R7 are selected from the group consisting of cyano, halogen, and α-haloalkyl, α-haloalkoxy, amido, sulfonyl, carbonyl, carbonyloxy and oxycarbonyl substituents containing up to 10 carbon atoms, L denotes one of formulae (B)

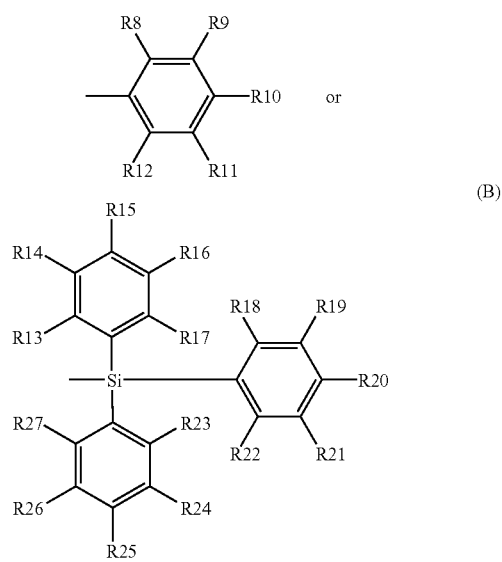

(B)

wherein R8 to R12 independently represent hydrogen or hydrocarbon groups of from 1 to 12 carbon atoms, with the proviso that R8 and R9 together or R9 and R10 together can form a fused benzo ring, R13 to R27 independently represent hydrogen or hydrocarbon groups of from 1 to 12 carbon atoms, with the proviso that R13 and R14 or R14 and R15 can form a fused benzo ring, R18 and R19 or R19 and R20 can form a fused benzo ring, and R23 and R24 or R24 and R25 can form a fused benzo ring, wherein said organic guest material of phosphorescent material is 2,3,7,8,12,13,17,18-octaethyl-21H, 23H-porphine platinum (II), wherein said aluminum chelate complex represented by the general formula (A) does not include formula 52,

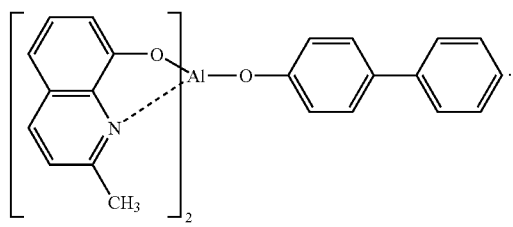

(52)

2. An organic electroluminescence element comprising:

an anode; a hole transport layer; a light emitting layer made of organic compounds; an electron transport layer; and a cathode which are layered in order, wherein the light emitting layer and the electron transport layer are in direct contact with each other without any hole blocking layer provided between the light emitting layer and the electron transport layer, wherein said light emitting layer comprises an organic host material having an electron transport capability and an organic guest material of phosphorescent material;

wherein an ionization potential energy of said organic host material is higher than that of said hole transport layer;

wherein the difference in the ionization potential energy between said organic host material of said light emitting layer and said hole transport layer is in a range from 0.4 eV to 0.8 eV; and wherein said organic host material comprises an aluminum chelate complex represented by a general formula (A)

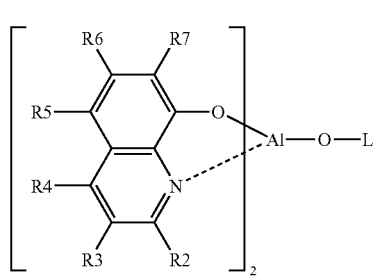

(A)

wherein R2 denotes an alkyl, oxy, amino or hydrocarbon substituent having at least 1 carbon atom, with a carbon atom number being 1 to 10 in any one hydrocarbon moiety, R3 to R7 independently denote a hydrogen atom, alkyl, oxy, amino or hydrocarbon substituent having at least 1 carbon atom, with a carbon atom number being 1 to 10 in any one hydrocarbon moiety, R5, R6 and R7 are selected from the group consisting of cyano, halogen, and α-haloalkyl, α-haloalkoxy, amido, sulfonyl, carbonyl, carbonyloxy and oxycarbonyl substituents containing up to 10 carbon atoms, L denotes one of formulae (B)

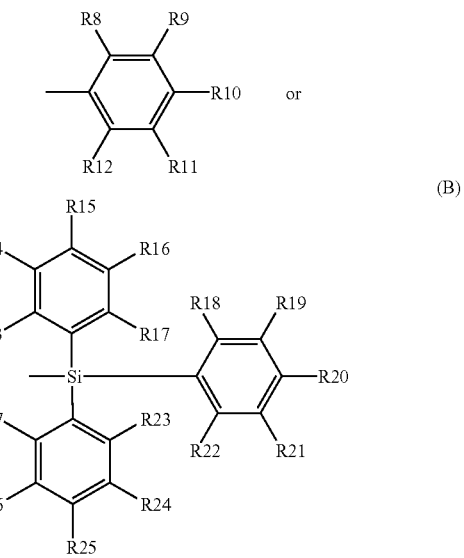

wherein R8 to R12 independently represent hydrogen or hydrocarbon groups of from 1 to 12 carbon atoms, with the proviso that R8 and R9 together or R9 and R10 together can form a fused benzo ring, R13 to R27 independently represent hydrogen or hydrocarbon groups of from 1 to 12 carbon atoms, with the proviso that R13 and R14 or R14 and R15 can form a fused benzo ring, R18 and R19 or R19 and R20 can form a fused benzo ring, and R23 and R24 or R24 and R25 can form a fused benzo ring, wherein said organic guest material of phosphorescent material is bis(2-(2'-benzo[4,5-α] thienyl)pyridinato-N, C3)iridium, wherein said aluminum chelate complex represented by the general formula (A) does not include formula 52,

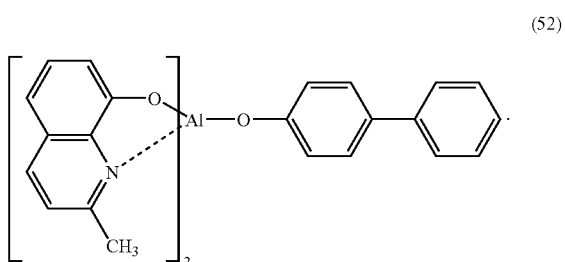

(52)

3. An organic electroluminescence element comprising:

an anode; a hole transport layer; a light emitting layer made of organic compounds; an electron transport layer; and a cathode which are layered in order, wherein the light emitting layer and the electron transport layer are in direct contact with each other without any hole blocking layer provided between the light emitting layer and the electron transport layer, wherein said light emitting layer comprises an organic host material having an electron transport capability and an organic guest material of phosphorescent material;

wherein an ionization potential energy of said organic host material is higher than that of said hole transport layer;

wherein the difference in the ionization potential energy between said organic host material of said light emitting layer and said hole transport layer is in a range from 0.4 eV to 0.8 eV; and wherein said organic host material comprises an aluminum chelate complex having an ether bond represented by any one of following formulae (76)-(81):

(76)
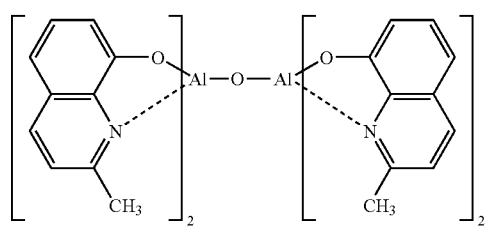

(77)
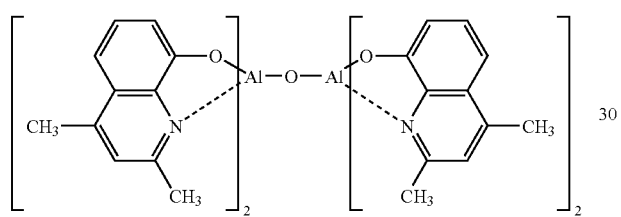

(78)
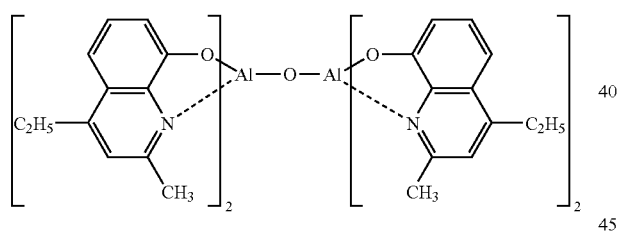

(79)
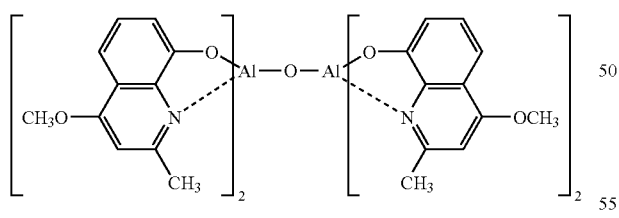

(80)
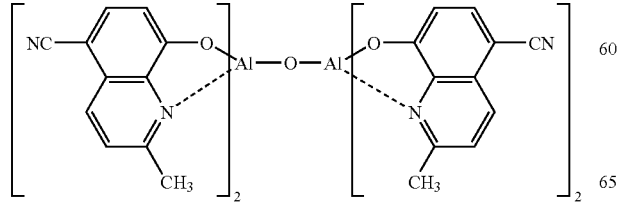

-continued

(81)
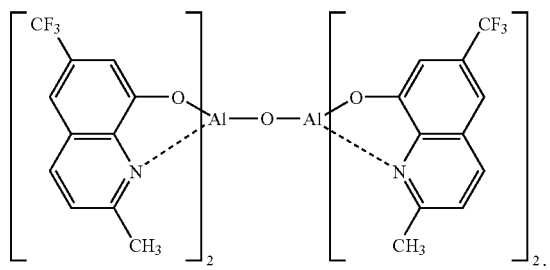

4. An organic electroluminescence element comprising:

an anode; a hole transport layer; a light emitting layer made of organic compounds; an electron transport layer; and a cathode which are layered in order, wherein the light emitting layer and the electron transport layer are in direct contact with each other without any hole blocking layer provided between the light emitting layer and the electron transport layer, wherein said light emitting layer comprises an organic host material having an electron transport capability and an organic guest material of phosphorescent material;

wherein an ionization potential energy of said organic host material is higher than that of said hole transport layer;

wherein the difference in the ionization potential energy between said organic host material of said light emitting layer and said hole transport layer is in a range from 0.4 eV to 0.8 eV; and wherein said organic host material comprises an aluminum chelate complex represented by a general formula (A)

(A)
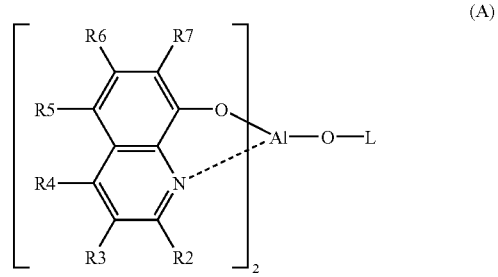

wherein R2 denotes an alkyl, oxy, amino or hydrocarbon substituent having at least 1 carbon atom, with a carbon atom number being 1 to 10 in any one hydrocarbon moiety, R3 to R7 independently denote a hydrogen atom, alkyl, oxy, amino or hydrocarbon substituent having at least 1 carbon atom, with a carbon atom number being 1 to 10 in any one hydrocarbon moiety, R5, R6 and R7 are selected from the group consisting of cyano, halogen, and α-haloalkyl, α-haloalkoxy, amido, sulfonyl, carbonyl, carbonyloxy and oxycarbonyl substituents containing up to 10 carbon atoms, L denotes one of formulae (B)

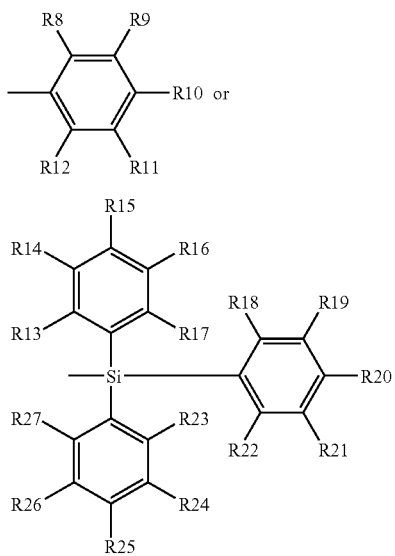

(B)

wherein R8 to R12 independently represent hydrogen or hydrocarbon groups of from 1 to 12 carbon atoms, with the proviso that R8 and R9 together or R9 and R10 together can form a fuse benzo ring, R13 to R17 independently represent hydrogen or hydrocarbon groups of from 1 to 12 carbon atoms, with the proviso that R13 and R14 or R14 and R15 can form a fused benzo ring, R18 and R19 or R19 and R20 can form a fused benzo ring, and R23 and R24 or R24 and R25 can form a fused benzo ring, wherein said aluminum chelate complex represented by the general formula (A) does not include formula 52,

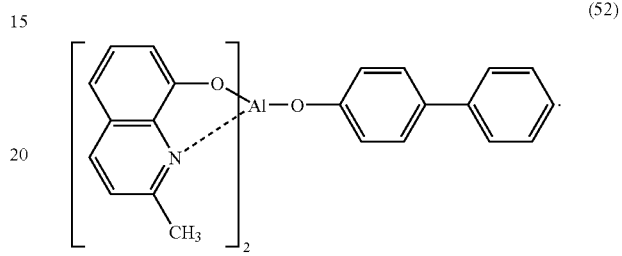

(52)

* * * * *